(12) United States Patent
Augustyniak et al.

(10) Patent No.: US 8,217,711 B2
(45) Date of Patent: Jul. 10, 2012

(54) CHARGE PUMP WITH SELF-TIMING AND METHOD

(75) Inventors: Marcin K. Augustyniak, Regensburg (DE); Bernhard Wicht, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 220 days.

(21) Appl. No.: 12/711,078

(22) Filed: Feb. 23, 2010

(65) Prior Publication Data
US 2010/0264981 A1  Oct. 21, 2010

(30) Foreign Application Priority Data
Feb. 25, 2009 (DE) .................... 10 2009 010 550

(51) Int. Cl.
*G05F 1/10* (2006.01)
(52) U.S. Cl. .................................................. 327/536
(58) Field of Classification Search .............. 327/536, 327/537, 589
See application file for complete search history.

(56) References Cited

U.S. PATENT DOCUMENTS

| 4,656,369 | A | | 4/1987 | Lou | |
|---|---|---|---|---|---|
| 5,483,434 | A | * | 1/1996 | Seesink | 363/60 |
| 5,801,934 | A | * | 9/1998 | Lacey et al. | 363/60 |
| 5,912,560 | A | * | 6/1999 | Pasternak | 324/536 |
| 6,100,752 | A | | 8/2000 | Lee et al. | |
| 6,208,198 | B1 | * | 3/2001 | Lee | 327/536 |
| 6,459,328 | B1 | * | 10/2002 | Sato | 327/536 |
| 6,472,926 | B2 | * | 10/2002 | Taito et al. | 327/536 |
| 7,142,040 | B2 | * | 11/2006 | Naka et al. | 327/536 |

* cited by examiner

*Primary Examiner* — Hai L Nguyen
(74) *Attorney, Agent, or Firm* — John J. Patti; Wade J. Brady, III; Frederick J. Telecky, Jr.

(57) ABSTRACT

With conventional charge pumps, significant noise is present due at least in part to large changes in the supply current. To combat this problem, a charge pump is provided that includes a number of stages. These stages are coupled to receive periodic alternating voltages having a phase shift with respect to each other so that the changes in the supply current are reduced, which reduces noise.

8 Claims, 2 Drawing Sheets

CHARGE PUMP WITH SELF-TIMING AND METHOD

CROSS-REFERENCE TO RELATED APPLICATIONS

This application claims priority from German Patent Application No. 10 2009 010 550.6, filed Feb. 25, 2009, which is hereby incorporated by reference for all purposes.

FIELD OF THE INVENTION

The invention generally relates to a charge pump and a method of operating a charge pump.

BACKGROUND

Referring to FIG. 1 of the drawings, the reference numeral 100 generally designates a conventional charge pump. Charge pump 100 generally comprises diodes D1 and D2 and capacitors CD, CS, and CP. In operation, a supplemental voltage VSUP and supplemental current ISUP are applied to the buffer capacitor and diode D1, and an alternating voltage VCLK is applied to pumping capacitor CP (which is coupled between diodes D1 and D2). Additionally, storage or buffer capacitor CS and diode D3 are coupled to output node OUT.

Turning now to FIG. 2, the operation of charge pump 100 can generally be seen. As the alternating voltage VCLK, the voltage at node VP increases, and when the voltage at node VP becomes large enough, a charge flows from capacitor CP through diode D2 to output node OUT. Then, when alternating voltage VCLK falls, the voltage at node VP falls, allowing current ISUP (through diode D1) to charge capacitor CP until capacitor CP is charged. This increase or spike in current ISUP is seen on the falling edges of the voltage VCLK in FIG. 2.

Sudden changes and other variations of the supply current ISUP, though, generate noise, which is generally undesirable. So, in order to reduce the amount of noise, a capacitor CD is used at the input of the charge pump, which serves to provide charge during the peaks of supply current ISUP. However, even with a buffer capacitors CD, noise can not be sufficiently reduced. Therefore, there is a need for a charge pump with reduced noise.

SUMMARY

In accordance with a preferred embodiment of the present invention, a charge pump is provided. The charge pump receives a supply voltage and a supply current from a power supply. The charge pump generates a charge pump output voltage at an output node. The charge pump includes a plurality of capacitors and diodes. Each capacitor is coupled with one side to a diode, and each diode is coupled in forward direction to the output node. Further diodes may be provided each of which couples this side of the capacitor in reverse direction to a supply voltage node. The other sides of the capacitors are coupled to alternating voltages, which have a phase shift with respect to each other.

This reduces supply current peaks as the magnitudes of the supply currents for each diode-capacitor combination can be smaller as for a single capacitor. Furthermore, as the point of time of the supply current peak for each diode-capacitor path is different (phase shifted), the demand of current can be evenly distributed over time and therefore be smoother as for a single capacitor. Current peaks can be reduced, which reduces noise that otherwise propagates through the power rails through the device.

The alternating voltages may advantageously be periodic signals as, for example clock signals. The clock period of all alternating voltages may preferably be equal. The alternating voltages may then be phase shifted with respect to each other. In an embodiment, the phase relationship of the alternating voltages is such that rising and the falling edges of the alternating voltage do not coincide. The falling and rising edges of the alternating voltage may be optimally spread over a clock period of a common clock period of the alternating voltages.

In accordance with a preferred embodiment of the present invention, a ring oscillator may be employed. The alternating voltages may then be generated with a ring oscillator. The ring oscillator may have a plurality of delay elements. The alternating voltages may then be the tap voltages between the delay elements. The other sides of the capacitors may then be coupled to the tap nodes between the delay elements. This provides a self timing configuration in which the phase relationship between the alternating voltages is always optimally spread over a clock period of the ring oscillator.

The ring oscillator may have a variable oscillation frequency. This allows the clock period of the alternating voltages to be adapted. The delay elements may be inverters with a variable slew rate for adjusting the oscillation frequency. In another aspect of the invention, the electronic device may be configured in a closed loop configuration for controlling the oscillating frequency of the ring oscillator in response to an output voltage or an output current (e.g. load current) of the charge pump.

In accordance with a preferred embodiment of the present invention, the delay elements of the ring oscillator may then be configured to have a delay which is controlled as a function of an output voltage and/or an output current of the charge pump.

In accordance with a preferred embodiment of the present invention, the charge pump may comprise at least a first and a second capacitor and a first and a second diode. The first capacitor may be coupled to receive at a first side a first alternating voltage. The first capacitor may be coupled with a second side to a first diode. The first diode can be coupled to an output node in a forward biased manner. This means that the anode of the diode is coupled to the capacitor and the cathode is coupled to the output node. A second capacitor may be coupled to receive at a first side a second alternating voltage. A second side of the second capacitor may then be coupled to a second diode which is coupled to the output node in a forward biased manner. Two more diodes may be provided for coupling the second sides of the first and second capacitor in reverse direction to a supply voltage node. Coupled in reverse direction means that the cathode of these diodes is coupled to the respective first sides of the capacitors and the respective anodes of the diodes are coupled to the supply voltage level.

In accordance with a preferred embodiment of the present invention, a first inverter (as one type of a delay element) may be coupled between the first node of the first capacitor and the first node of the second capacitor so as to receive the first alternating voltage as input signal and to provide the second alternating voltage as an output signal to the first side of the second capacitor. A third capacitor, a third diode and a second inverter may be provided. The third capacitor may then be coupled to receive at a first side a third alternating voltage. A second side of the third capacitor may be coupled to the third diode which is coupled to the output node in a forward biased manner. Furthermore, a second inverter may then be coupled between the first node of the second capacitor and the first node of the third capacitor so as to receive the second alternating voltage as input signal and to provide the second alternating voltage as an output signal to the first side of the third capacitor. A third inverter may be provided and coupled with an input to the first side of the third capacitor and with an output to the first side of the first capacitor so as to form a ring oscillator with the first and the second inverter. Three more diodes may be coupled between a power supply node (e.g. input voltage of the charge pump, supply voltage, supply current) and the respective second sides of the first, second and/or third capacitors (plurality of capacitors), for providing supply current to the second sides of the capacitors for recharge. This provides a self-timed charge pump operation without an external clock signal as in the prior art.

The first, second and/or third inverter may have a variable slew rate and a control input for controlling the slew rate. In an aspect of the invention, a closed loop may be implemented where the output voltage or output current of the charge pump is determined and used for controlling the delay elements, i.e., for example the inverters. The delay of the delay elements may then be decreased for a decreasing charge pump output voltage and the delay may be increased for an increasing charge pump output voltage. An operational amplifier may then be provided which may be coupled to control the delay elements accordingly. The variable slew rate of inverters may be used for implementing this control mechanism. However, other parameters, as for example the capacitance values of the capacitors or the supply voltage level may be varied for controlling the charge pump output voltage.

In accordance with a preferred embodiment of the present invention, a method of generating an output voltage (at an output node) from an input voltage is also provided. A second side of a plurality of capacitors may be driven with a plurality of phase shifted alternating voltages. Each capacitor of the plurality of capacitors may then be coupled through a diode to an output node. Each capacitor of the plurality of capacitors may also be coupled through a diode to receive the input voltage (e.g. a supply voltage). Advantageously, the plurality of phase shifted alternating voltages may be provided through tap voltages of a ring oscillator. Accordingly, a self adjusting optimized charge pumping method can be provided, which has reduced supply current peaks and therefore reduced noise. In an embodiment of the invention, an oscillating frequency of the ring oscillator may be controlled in response to an output voltage and/or an output current of the charge pump. This means that closed loop configuration is provided, where the ring oscillator is controlled as a function of a signal of an output of the charge pump.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
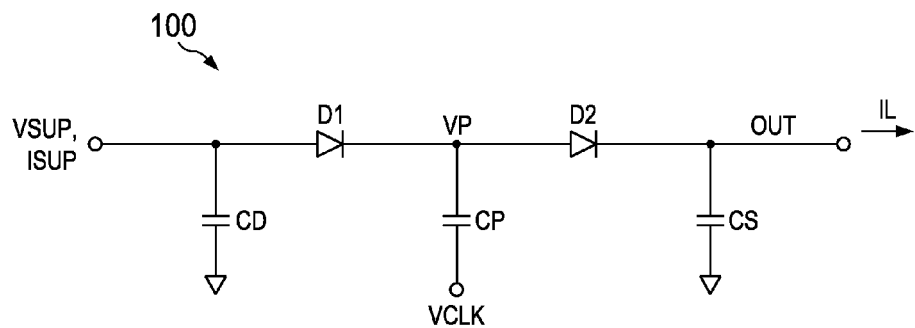
FIG. 1 is a circuit diagram of a conventional charge pump.

Refer now to the drawings wherein depicted elements are, for the sake of clarity, not necessarily shown to scale and wherein like or similar elements are designated by the same reference numeral through the several views.

Figure 3:
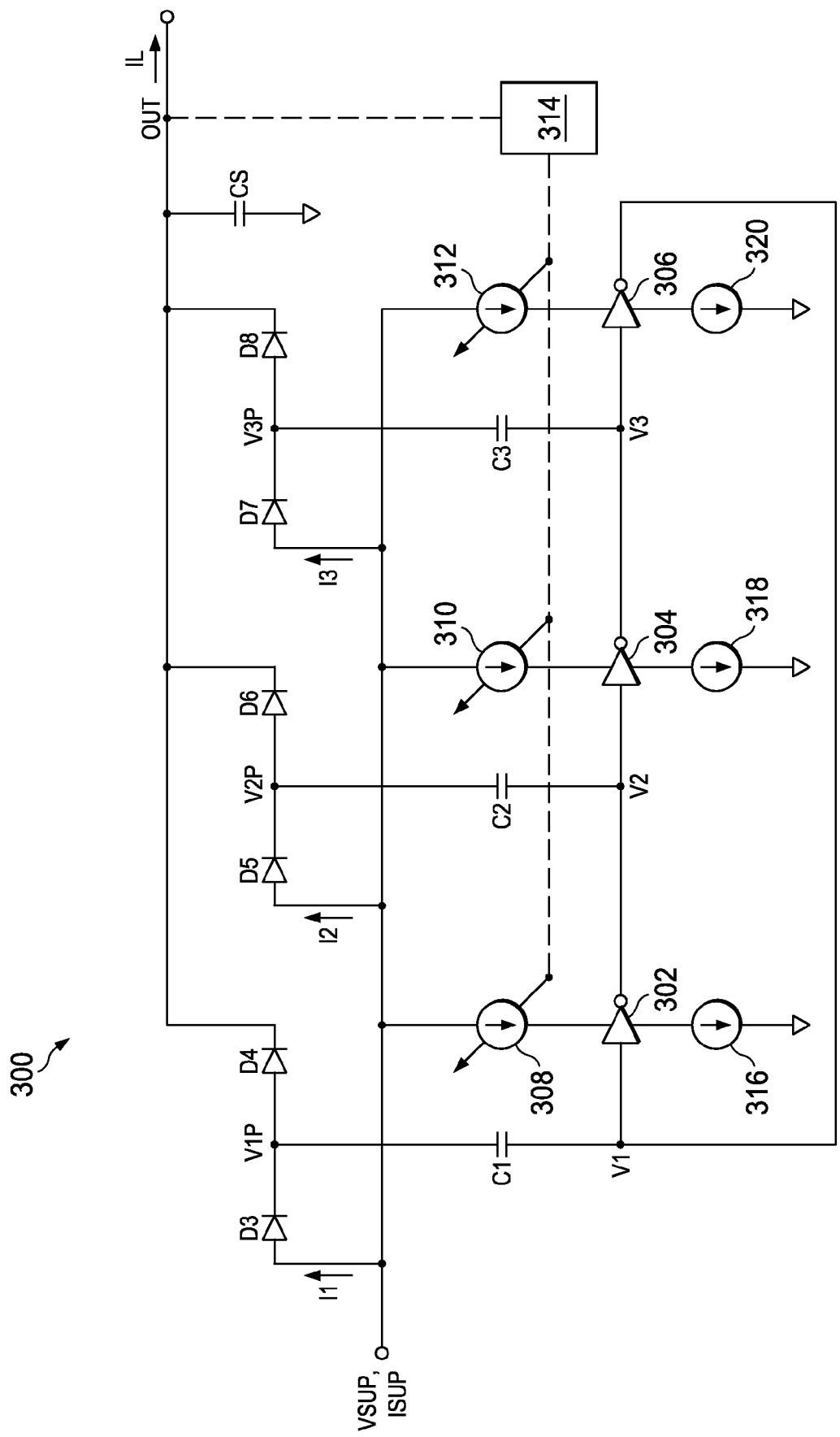
FIG. 3 is a circuit diagram of an example of a charge pump in accordance with a preferred embodiment of the present invention.

Referring now to FIG. 3 of the drawings, the reference numeral 300 generally designates an example of a charge pump in accordance with a preferred embodiment of the present invention. Charge pump 300 (which may be included on an integrated circuit or semiconductor chip) generally comprises diodes D3 through D8, capacitors C1, C2, C3, and CS, and a ring oscillator. The ring oscillator generally comprises inverters 302, 304, and 306, current sources 316, 318, and 320, adjustable current sources 308, 310, and 312, and an (optional) error amplifier 314. In operation, alternating voltages from the ring oscillator at nodes V1, V2 and V3 (which are the of ring oscillator) are applied to capacitors C1, C2, and C3, respectively. The alternating voltages at nodes V1, V2, and V3 have the same clock frequency or clock period and have a phase relationship that is defined by the ring oscillator. The phase relationship is self adjusting in that the phases are automatically spread across a clock period. The inverters 302, 304, and 306 have a variable slew rate for adjusting the clock period (oscillating frequency) of the ring oscillator. The control mechanism is based on a current fed to the inverters 302, 304, and 306 with current sources 308, 310, 312, 316, 318, and 320. A greater current increases the oscillation frequency (decreases the clock period), and a smaller current decreases the oscillation frequency. The current (and therefore the slew rate and oscillation frequency) may be controlled through external or internal control signals through the adjustment and control of current sources 308, 310, and 312.

Charge pump 300 may also be configured as a regulated charge pump with a closed-loop operation. Here, (indicated with dashed lines) the currents of the may then be adjusted as a function of the output voltage at node OUT, a load current IL, or some combination thereof. For example, if the output voltage on node OUT drops due to a rising load current IL, current for each of the current source 308, 310, and 312 may be increased to reduce the delay of the inverters 302, 304, and 306, which increases the oscillating frequency of the ring oscillator. This increases the amount of charge (per unit time) available at the charge pump 300 to output at node OUT, and a sudden drop of the output voltage on node OUT can therefore be avoided. Furthermore, the charge pump 300 may provide a more precise and stable output voltage at node OUT than in the open-loop configuration. There are less variations of the output voltage and the output impedance is reduced. Under these circumstances, this may be implemented with error amplifier 314 is coupled to increase current for current sources 308, 310, and 312 for an decreasing output voltage at node OUT. Alternatively, other parameters may be varied in response to the output voltage at node OUT and/or an output current, and these other parameters may be the capacitance values of capacitors C1 to C3 or the supply voltage level VSUP as a function of the charge pump output voltage OUT and/or the output current IL.

As a result of having three separate capacitors C1, C2, and C3 (instead of one capacitor CP of charge pump 100), the supply current ISUP can therefore split into three instances. Specifically, in charge pump 300, three partial phase shifted currents I1, I2, and I3 are drawn from the supply, and the voltage supply VSUP experiences an overlay of the three instances or current I1, I2 and I3 instead of one sudden peak of current ISUP as in the prior art charge pump. This is illustrated in FIG. 4.

Figure 2:
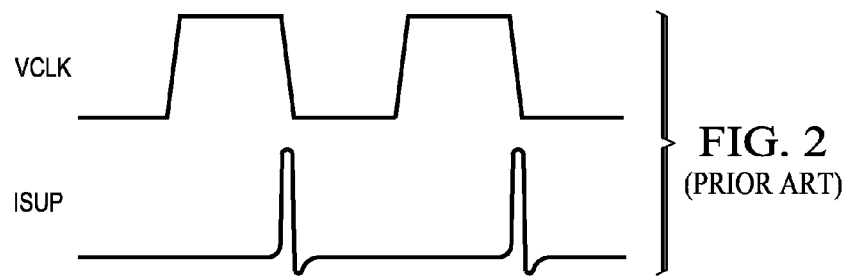
FIG. 2 shows waveforms of an alternating voltage and supply current for the charge pump of FIG. 1.
Figure 4:
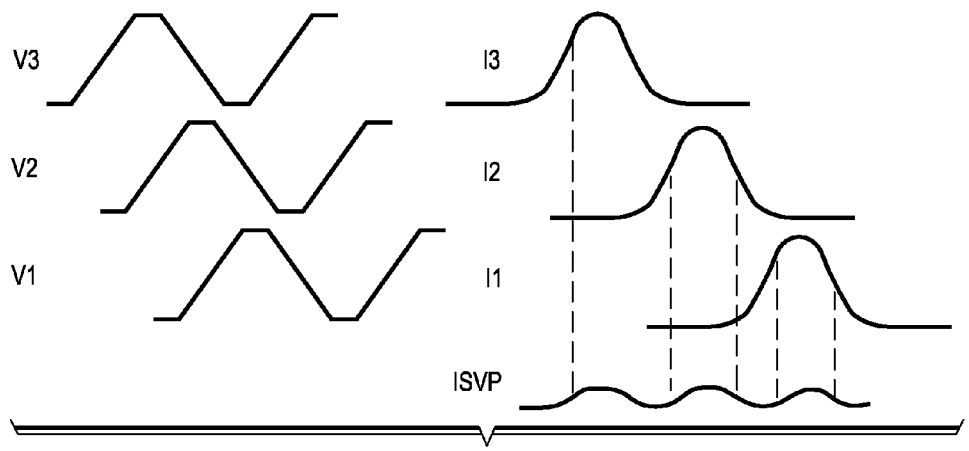
FIG. 4 shows waveforms relating charge pump of FIG. 3.

In FIG. 4, waveforms of voltages at node V1, V2, and V3 and currents I1, I2, I3,and ISUP are shown. The alternating voltages nodes V1, V2, and V3 are phase shifted with respect to each other and are evenly spread over their common clock period. The voltage at node V1 has a phase shift of 120° with respect to the voltage at node V2, and the voltage at node V2 has a phase shift of 120° with respect to the voltage at node V3. The phase distribution of the alternating voltages at nodes V1, V2 and V3 entails a similar phase distribution of the supply current components I1, I2 and I3, which also have a phase shift of 120° with respect to each other. The combined supply current ISUP that is provided from the power supply rails is smoother and more constant than shown in FIG. 2 for conventional charge pumps.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a supply node;
an output node;
a plurality of charge pump stages that are each coupled to the supply node and the output node, wherein each stage include:
a first diode that is coupled to the supply node;
a second diode that is coupled between the first diode and the output node; and
a capacitor that is coupled to a node between the first and second diodes;
an ring oscillator having a plurality of taps, wherein each tap is coupled to at least one of the charge pump stages at its capacitor, and wherein each of the taps provides an alternating voltage that is phase shifted from phase shifted from one another, wherein the ring oscillator includes a plurality of adjustable current sources; and
an error amplifier that is coupled to the output node and each of the adjustable current sources, wherein the error amplifier controls each of the adjustable current sources.

2. The apparatus of claim 1, wherein the ring oscillator further comprises a plurality of inverters that are coupled in series with one another each adjustable current source is coupled between the supply node and at least one of the inverters.

3. An apparatus comprising:
a supply node;
an output node;
a plurality of charge pump stages that are each coupled to the supply node and the output node, wherein each stage include:
a first diode that is coupled to the supply node;
a second diode that is coupled between the first diode and the output node; and
a pumping capacitor that is coupled to a node between the first and second diodes;
an ring oscillator having a plurality of taps, wherein each tap is coupled to at least one of the charge pump stages at its pumping capacitor, and wherein each of the taps provides an alternating voltage that is phase shifted from phase shifted from one another, wherein the ring oscillator includes a plurality of adjustable current sources;
an error amplifier that is coupled to the output node and each of the adjustable current sources, wherein the error amplifier controls each of the adjustable current sources; and
a buffer capacitor that is coupled to the output node.

4. The apparatus of claim 3, wherein the ring oscillator further comprises a plurality of inverters that are coupled in series with one another wherein each adjustable current source is coupled between the supply node and at least one of the inverters.

5. An apparatus comprising:
a supply node;
an output node;
a first charge pump stage having:
a first diode that is coupled to the supply node;
a second diode that is coupled between the first diode and the output node; and
a first pumping capacitor that is coupled to a node between the first and second diodes;
a second charge pump stage having:
a third diode that is coupled to the supply node;
a fourth diode that is coupled between the third diode and the output node; and
a second pumping capacitor that is coupled to a node between the third and fourth diodes;
a third charge pump stage having:
a fifth diode that is coupled to the supply node;
a sixth diode that is coupled between the fifth diode and the output node; and
a third pumping capacitor that is coupled to a node between the fifth and sixth diodes;
an ring oscillator having:
a first oscillator stage that is coupled to the first pumping capacitor, wherein the first oscillator stage includes a first adjustable current source that is coupled to the source node;
a second oscillator stage that is coupled to the second pumping capacitor, wherein the second oscillator stage includes a second adjustable current source that is coupled to the source node; and
a third oscillator stage that is coupled to the third pumping capacitor, wherein the third oscillator stage includes a third adjustable current source that is coupled to the source node, and wherein the first, second, and third stages are coupled in series with one another;
an error amplifier that is coupled to the output node, the first adjustable current source, the second adjustable current source, and the third adjustable current source, wherein the error amplifier controls each of the first, second, and third adjustable current sources; and
a buffer capacitor that is coupled to the output node.

6. The apparatus of claim 5, wherein the first oscillator stage further comprises:
a first stage input node that is coupled to the first pumping capacitor;
a first inverter that is coupled to the first stage input node, wherein the first adjustable current is coupled between the supply node and the first inverter; and
a first current source that is coupled between the first inverter and ground.

7. The apparatus of claim 6, wherein the second oscillator stage further comprises:
a second stage input node that is coupled to the second pumping capacitor and the first inverter;
a second inverter that is coupled to the second stage input node, wherein the second adjustable current is coupled between the supply node and the second inverter; and
a second current source that is coupled between the second inverter and ground.

8. The apparatus of claim 7, wherein the third oscillator stage further comprises:
- a third stage input node that is coupled to the third pumping capacitor and the second inverter;
- a third inverter that is coupled to the third stage input node and the first stage input node, wherein the third adjustable current is coupled between the supply node and the third inverter; and
- a third current source that is coupled between the third inverter and ground.

* * * * *